United States Patent [19]

Engelhardt

[11] 3,964,315

[45] June 22, 1976

[54] APPARATUS INCLUDING NOVEL BRIDGE CIRCUIT

[75] Inventor: John S. Engelhardt, Hartsdale, N.Y.

[73] Assignee: The Anaconda Company, New York, N.Y.

[22] Filed: Jan. 11, 1974

[21] Appl. No.: 432,778

[52] U.S. Cl. .............................. 73/362 AR; 73/350; 323/75 B; 323/75 H; 323/75 K
[51] Int. Cl.² ..................... G01K 7/20; G01R 17/10; G01R 27/16
[58] Field of Search ...................... 73/350, 362 AR; 323/75 B, 75 H, 75 N, 75 K

[56] References Cited
UNITED STATES PATENTS

| | | | |
|---|---|---|---|
| 964,961 | 7/1910 | Fisher | 73/359 X |
| 2,612,779 | 10/1952 | Mulford | 73/359 |
| 2,782,102 | 2/1957 | Howe | 324/62 R X |
| 3,226,636 | 12/1965 | Buiting | 324/65 R |
| 3,296,866 | 1/1967 | Zenmon et al. | 73/362 AR |
| 3,333,476 | 8/1967 | Hardy et al. | 73/362 AR |
| 3,748,655 | 7/1973 | Engelhardt et al. | 73/362 AR X |

Primary Examiner—James J. Gill
Assistant Examiner—Frederick Shoon
Attorney, Agent, or Firm—Pennie & Edmonds

[57] ABSTRACT

A bridge circuit for measuring the D.C. resistance of a resistive element having an induced A.C. current comprises impedance legs whereby the A.C. component can be balanced out. The invention has particular application to the measurement of high-voltage cable conductor temperatures.

14 Claims, 3 Drawing Figures

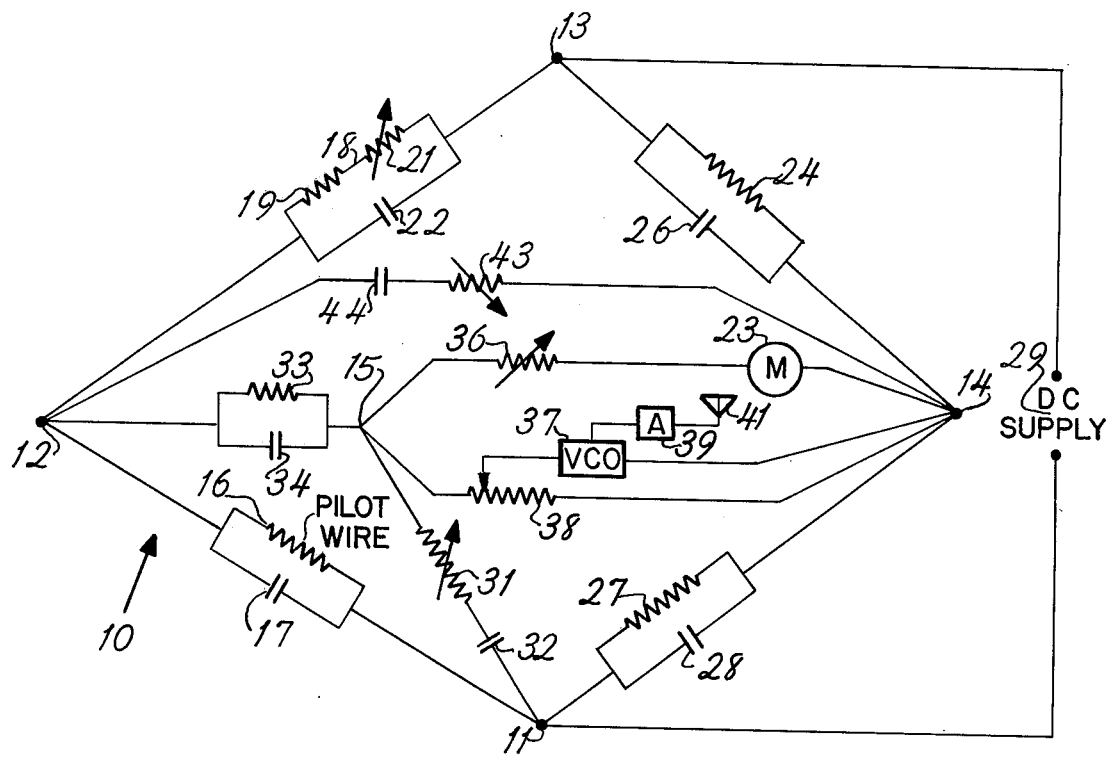
Fig. 1
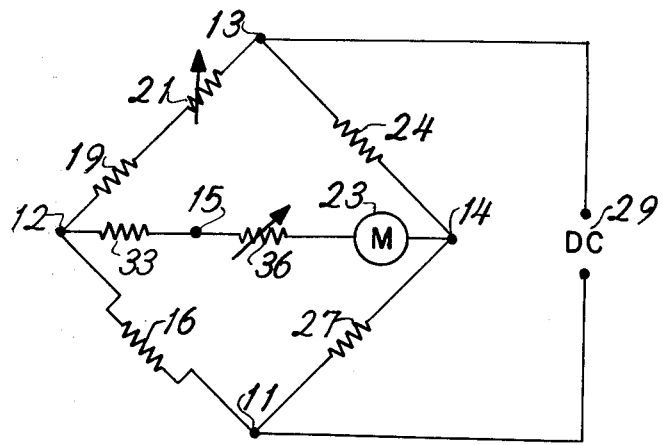
Fig. 2 - D.C. EQUIVALENT
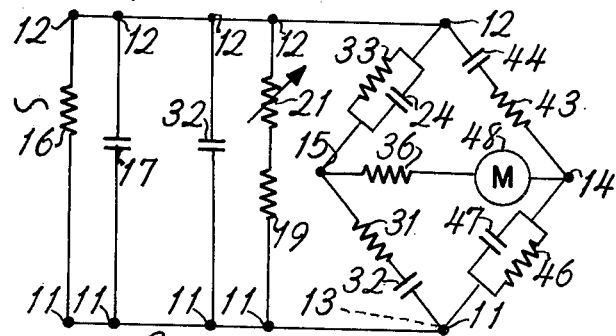
Fig. 3 - EQUIVALENT A.C.

APPARATUS INCLUDING NOVEL BRIDGE CIRCUIT

BACKGROUND OF THE INVENTION

In U.S. Pat. Nos. 3,491,597, 3,633,191 and 3,748,655, The disclosures of which are incorporated herein by reference, Engelhardt and Ebel have described apparatus for monitoring the conductor temperatures of a high voltage cable utilizing an insulated pilot wire that is in thermal contact with the cable conductor. The resistance of the pilot wire, which varies with temperature, is measured by means of a bridge, the pilot wire being included within one leg thereof. Instead of adjusting the bridge resistors to obtain a null point on a galvanometer as with a classical Wheatstone bridge, the resistors have been adjusted to read null at a pilot wire temperature of zero degrees Celsius, and the degree of unbalance, indicative of the pilot wire resistance, and thus its temperature, is determined from the scale reading of a milliameter. The apparatus of the above-named patents has found its principle application in monitoring three-phase A.C. cables and in this service it has been found that where a pilot wire is incorporated in the conductor of one of the phases, currents induced in it from the other two phase conductors interfere seriously with the bridge readings, and particularly with the operation of any voltage controlled oscillator and amplifier that may be used for radio transmission of the bridge measurements. In the U.S. Pat. No. 3,748,655 it was sought to overcome this problem by means of a large capacitor across the series-connected pilot wire and return conductor. This means has, however, not proven adequate for complete elimination of interference from the induced variable currents and from the sixty hertz voltage drop in the power conductor itself, where this serves as a return lead from the far end of the pilot wire. The present invention does, however, completely eliminate this problem as well as similar problems of induced currents in long leads between a bridge and the resistive element, such as a thermocouple, being measured.

SUMMARY

I have invented an apparatus for measuring the D.C. resistance of a resistive element carrying an A.C. current component, comprising first, second, third, fourth and fifth conductor junctions in which the element is joined to the first and second junction and a first resistor and first capacitor are joined, in series, to the first and fifth junction. My apparatus also comprises a second resistor and second capacitor joined, in parallel, to the second and fifth junction, a third resistor and third capacitor joined, in series, to the second and fourth junction, a fourth resistor joined to the third and fourth junction and a fifth resistor joined to the first and fourth junction. A fourth capacitor is joined to the fourth and either the third or first junction in parallel with the fourth or fifth resistor. My apparatus also comprises a sixth resistor joined to the second and third junction, a D.C. power supply joined to the first and third junction and a potential measuring means joined to the fifth and fourth junction so that the first, second, third and fourth junctions form the terminal points of a D.C. bridge for measuring the resistance of the element and the first, second, fourth and fifth junctions form the terminal points of an A.C. bridge for balancing out A.C. current components. Preferably the fourth capacitor will be joined parallel to the fourth resistor and a fifth capacitor will be joined to the first and fourth junction, parallel to the fifth resistor. Advantageously also, the first, third and sixth resistors may be variable, a capacitor may join the first and second junction in parallel with the resistive element being measured, and it may comprise a resistor between the fourth and fifth junction in series with the measuring means. The measuring means may, advantageously, comprise indicator means responsive to the magnitude of the element resistance and a voltage controlled oscillator responsive to the voltage across the fourth and fifth junction.

I have invented an apparatus for measuring the D.C. resistance of a resistive element carrying an A.C. current component comprising a D.C. bridge circuit with four impedance legs and four junctions joining the legs, and having the element included in one of the legs. A D.C. power supply joins two of the junctions and a potential measuring means joins another two of the four junctions. My apparatus also comprises an A.C. bridge circuit comprising four impedance legs and four junctions joining them, with three of the junctions of the A.C. circuit being in common with three of the junctions of the D.C. circuit. One of the legs of the A.C. circuit that joins one of these common junctions is joined, in series with the measuring means, to another of the common junctions. Advantageously, the element being measured is in thermal contact with a high voltage cable conductor and the apparatus provides means for measuring the conductor temperature while the whole circuit has assumed the high conductor potential and is insulated from ground.

BRIEF DESCRIPTION OF THE DRAWINGS

FIG. 1 shows a circuit diagram of my invention.
FIG. 2 shows the D.C. equivalent of the circuit of FIG. 1.
FIG. 3 shows the A.C. equivalent of the circuit of FIG. 1.

DETAILED DESCRIPTION OF PREFERRED EMBODIMENT

In FIG. 1 the circuit of my apparatus is indicated generally by the numeral 10 with five junctions 11, 12, 13, 14, 15. It will be understood that the numerals 11–15 refer to electrical junctions each of which may, in the usual manner comprise a plurality of connectors with negligble impedance between them. An element 16 whose resistance is to be measured joins the junctions 11, 12 in parallel with a capacitor 17. In the diagram of FIG. 1 the element 16 comprises a pilot wire that has been embedded in a high voltage cable conductor in series with the cable conductor itself which thus forms a portion of the element 16. For the measurement of the conductor temperature of a high voltage cable it is also practicable to utilize a twin pilot wire within the scope of the present invention in which case the cable conductor itself would not constitute the return lead. An A.C. current, shown symbolically in FIG. 3 is induced in the element 16 by the other phase conductors of the cable. In addition, where the cable conductor itself is used as a component of the element 16 an A.C. voltage drop, which may have a magnitude of 10 volts per thousand amperes must be vectorially added to the induced voltage whose effects are compensated in the present invention. This voltage drop is not shown separately in FIG. 3, but is considered, where applicable, to be included in the alternating voltage symbol. A resistor 18 made up of fixed and variable segments 19, 21 joins the junction 12 to the junction 13 in parallel with a capacitor 22. In operation the resistor 18 is adjusted to match the resistance of the element 16 at 0°C. Where, however, it is desired to use my apparatus in the manner of a Wheatstone bridge by obtaining a null reading on a milliameter 23 between the junctions 12 and 14, the segment 21 will be made fully adjustable to give the resistor 18 any value assumed by the element 16 being measured. A 1000-ohm resistor 24 joins the junctions 13, 14 in parallel with a capacitor 26 and a 1000 ohm resistor 27 joins the junctions 14, 11 in parallel with a capacitor 28. The resistors 24, 27 form two legs of a D.C. bridge. The capacitors 26, 28 have a total capacitance of 5.3 microfarads, and although I have found it convenient to employ two capacitors of 2.65 microfarads capacitance for this purpose it is only important, as shall be more fully explained hereinbelow, that the two capacitors, in parallel, should have a specified value, and this can be made up by any convenient combination including the complete omission of one of the capacitors 26 or 28. A 12 volt D.C. power supply 29 is applied across the junctions 11, 13. As has been explained in the patents included hereinabove by reference this supply is conveniently induced, rectified, and regulated from the power cable itself. A 50 ohm variable resistor 31 in series with a 53 microfarad capacitor 32 joins the junctions 11 and 15, and a 100 ohm resistor 33 in parallel with a 26.5 microfarad capacitor 34 joins the junctions 12 and 15.

A variable resistor 36 is inserted in series with the meter 23 merely for the adjustment of the latter. To permit remote reading of the present apparatus a radio signal can be broadcast and for this purpose the potential between the junctions 15 and 14 can be sensed by a voltage controlled oscillator 37 tapping a potentiometer 38 in cooperation with an amplifier-transmitter 39 and antenna 41.

A 250 ohm resistor 43, which may be variable, in series with a capacitor 44, joins the junctions 12 and 14.

For a better understanding of the principles of my invention FIGS. 2 and 3 representing D.C. and A.C. equivalents of the circuit of FIG. 1, have been added to the drawing. From FIG. 2 it will be seen that the apparatus of FIG. 1 functions for D.C. measurement of the resistance of the element 16 as a Wheatstone type bridge wherein the meter is calibrated to indicate the desired readings rather than a mere null joint. The resistors 31, 43, which are in series with the respective capacitors 32, 44 do not affect this D.C. circuit. The voltage controlled oscillator 37, and resistor 38 are, of course, applicable to this circuit, although they have been omitted from FIG. 2 for clarity. As shown in FIG. 3 the opposing junctions 12, 11 and 15, 14 form an A.C. bridge to which the numeral 13 has been dotted in to indicate that there is no effective 60 hertz impedance between the junction 13 and 11 when either a regulated rectified source or a battery is used for the supply 29. The resistor 24 and capacitor 26 then effectively parallel the resistor 27 and capacitor 28 in joining the junctions 11 and 14. The junctions 11, 12, and 14 are seen to be common to the D.C. equivalent bridge circuit of FIG. 2 and the A.C. equivalent bridge circuit of FIG. 3. The leg of the A.C. bridge that includes the resistor 33 is connected in series with the meter 23 (in FIG. 2) between the junctions 12 and 14 which are common to both circuits. Thus, for purposes of determining the unknown resistance of the element 16 the resistor 33 and capacitor 34 have no effect except to the degree that the resistor 33, added to the resistor 36 changes the sensitivity of the meter 23.

The resistors 24, 27 and capacitors 26, 28 are shown in FIG. 3 by the equivalent 500 ohm resistor 46 and 5.3 microfarad capacitor 47. The capacitors 32, 44 which were necessary to exclude the resistors 43, 31 from the D.C. circuit are balanced by including capacitors 17, 34 in the A.C. bridge, the voltage supply of which is shown symbolically as an A.C. component in the element 16. Since, in operation, the components forming the bridge of FIG. 3, once they have been adjusted for a null reading of a meter 48 will need no further adjustments even though the apparatus may be employed with different sizes and lengths of cable, this meter is conveniently not the same meter as the one that will be installed for measuring the cable temperatures on the D.C. bridge, and an oscilloscope can be used for the meter 48, adjusting resistors 31 and 43 to adjust the impedance for a null reading.

I have invented a new and useful apparatus of which the foregoing description has been exemplary rather than definitive and for which I desire an award of Letters Patent as defined in the following claims.

I claim:

1. An apparatus for measuring the D.C. resistance of a resistive element carrying an A.C. current component comprising:
    A. first, second, third, fourth and fifth conductor junctions, said element being joined to said first and said second junction,
    B. a first resistor and a first capacitor, said first resistor and capacitor being joined, in series, to said first and said fifth junction,
    C. a second resistor and a second capacitor, said second resistor and capacitor being joined, in parallel, to said second and said fifth junction,
    D. a third resistor and a third capacitor, said third resistor and capacitor being joined, in series, to said second and said fourth junction,
    E. a fourth resistor, said fourth resistor being joined to said third and said fourth junction,
    F. a fifth resistor, said fifth resistor being joined to said first and said fourth junction,
    G. a fourth capacitor, said fourth capacitor being joined to said fourth junction and to at least one of said third and said first junctions and in parallel with said resistor joined therebetween,
    H. A sixth resistor, said sixth resistor being joined to said second and said third junction,
    I. a D.C. power supply, said supply being joined to said third and said first junction, and
    J. potential measuring means, said measuring means being joined to said fifth and said fourth junction, whereby said first, second, third and fourth junctions form the terminal points of a D.C. bridge for measuring said resistance and said first, second, fourth and fifth junctions form the terminal points of an A.C. bridge for balancing out said A.C. current component.

2. The apparatus of claim 1 wherein said fourth capacitor is joined to said third and said fourth junction in parallel with said fourth resistor.

3. The apparatus of claim 2 comprising a fifth capacitor, said fifth capacitor being joined to said first and said fourth junction in parallel with said fifth resistor.

4. The apparatus of claim 1 wherein said fourth capacitor is joined to said first and said fourth junction in parallel with said fifth resistor.

5. The apparatus of claim 1 wherein said first resistor is variable.

6. The apparatus of claim 1 wherein said third resistor is variable.

7. The apparatus of claim 1 wherein said sixth resistor is variable.

8. The apparatus of claim 1 comprising a capacitor joining said first and said second junction in parallel with said element.

9. The apparatus of claim 1 comprising a capacitor joining said second and said third junction in parallel with said sixth resistor.

10. The apparatus of claim 1 comprising a resistor between said fourth and said fifth junction in series with said measuring means.

11. The apparatus of claim 1 wherein said measuring means comprises indicator means and the magnitude of said resistance is indicated by said indicator means.

12. The apparatus of claim 1 comprising a voltage controlled oscillator responsive to the potential across said fourth and said fifth junctions.

13. Apparatus measuring the D.C. resistance of a resistive element carrying an A.C. current component comprising:
  A. a D.C. bridge circuit comprising four junctions and four impedance legs with each leg connected between a pair of junctions, said element being included in one of said impedance legs,
  B. a D.C. power supply connected across said D.C. circuit to two of said junctions,
  C. an A.C. bridge circuit comprising four junctions and four impedance legs with each leg connected between a pair of junctions for balancing out said A.C. current component,
  D. potential measuring means connected between the other two of said junctions of said D.C. circuit,
  E. three of said junctions of said A.C. circuit being in common with three of said junctions of said D.C. circuit, and
  F. one of said legs of said A.C. circuit connecting with one of said common junctions forming a series D.C. path with said measuring means of said D.C. circuit.

14. The apparatus of claim 13 wherein said element is in thermal contact with the conductor of a high voltage cable and said apparatus provides means for measuring the temperature of said conductor.

* * * * *